United States Patent
Myohga et al.

[11] Patent Number: 6,111,479
[45] Date of Patent: Aug. 29, 2000

[54] LAMINATE PRINTED CIRCUIT BOARD WITH A MAGNETIC LAYER

[75] Inventors: Osamu Myohga; Shiro Yoshida; Mitsuo Saito; Yuzo Shimada; Hirokazu Tohya; Ryo Maniwa, all of Tokyo, Japan

[73] Assignee: NEC Corporation, Tokyo, Japan

[21] Appl. No.: 09/033,554

[22] Filed: Mar. 2, 1998

[30] Foreign Application Priority Data

Mar. 3, 1997 [JP] Japan ........................................ 9-047870

[51] Int. Cl.$^7$ ............................................. H03H 7/01
[52] U.S. Cl. ........................... 333/184; 333/185; 361/780
[58] Field of Search ................................. 333/181, 184, 333/185; 361/780, 794, 765

[56] References Cited

U.S. PATENT DOCUMENTS

| | | | |
|---|---|---|---|
| 4,746,557 | 5/1988 | Sakamoto et al. | 333/184 X |
| 5,157,576 | 10/1992 | Takaya et al. | 333/185 X |
| 5,165,055 | 11/1992 | Metsler | 333/181 X |

FOREIGN PATENT DOCUMENTS

| | | |
|---|---|---|
| 61-38970 | 3/1986 | Japan . |
| 61-173167 | 10/1986 | Japan . |
| 63-300593 | 12/1988 | Japan . |
| 64-25497 | 1/1989 | Japan . |
| 2-21700 | 1/1990 | Japan . |
| 3-208391 | 9/1991 | Japan . |
| 3-273699 | 12/1991 | Japan . |
| 4-3489 | 1/1992 | Japan . |
| 4-43016 | 4/1992 | Japan . |
| 4-302498 | 10/1992 | Japan . |
| 5-235679 | 9/1993 | Japan . |
| 6-61602 | 3/1994 | Japan . |
| 6-244582 | 9/1994 | Japan . |
| 9-139573 | 5/1997 | Japan . |
| 2734447 | 1/1998 | Japan . |
| 10-163636 | 6/1998 | Japan . |

*Primary Examiner*—Justin P. Bettendorf
*Attorney, Agent, or Firm*—McGuire, Woods, Battle & Boothe

[57] ABSTRACT

A laminate printed circuit board loaded with transistors, ICs (Integrated Circuits) or LSIs (Large Scale Integrated Circuits) and a method of producing the same are disclosed. The circuit board includes a signal layer, a ground layer and a power supply layer sequentially laminated with the intermediary of insulation layers. An impedance adding circuit is formed in the power supply layer. A magnetic layer is positioned at least above or at least blow the impedance adding circuit. The circuit board with this configuration reduces power supply noise to a noticeable degree.

32 Claims, 9 Drawing Sheets

[I]　　　　　　[II]

LAMINATE PRINTED CIRCUIT BOARD WITH A MAGNETIC LAYER

BACKGROUND OF THE INVENTION

The present invention relates to a laminate printed circuit board and a method of producing the same and, more particularly, to a laminate printed circuit board loaded with transistors, ICs (Integrated Circuits), LSIs (Large Scale Integrated Circuits) or similar circuit devices, and a method of producing the same.

The problem with a laminate printed circuit board of the type described is that the circuit board generates electromagnetic noise and causes an electronic equipment including it or other electronic equipments to malfunction, as well known in the art. The electronic noise is ascribable to radiations caused by currents derived from the parasitic capacitance and parasitic mutual inductance of the circuit and high frequency currents flowing into a power supply line. These causes are generally referred to as a common mode. Because the mechanism causing such radiations occur are complicated, implementations for coping with the above problem at positions adjoining the sources of radiations have not been available except for a metallic casing for electromagnetic shielding. The metallic casing accommodates the entire electronic equipment therein.

It is a common practice with a laminate printed circuit board to connect ICs/LSIs, which are the sources of high frequency power supply currents, between a power supply line implemented by a power supply layer and a ground line implemented by a ground layer. Decoupling capacitors are connected in parallel, each in the vicinity of the respective IC/LSI. The power supply layer is a full flat layer entirely constituted by a conductive film. With this configuration, the power supply layer maximizes the area over which a current flows and thereby reduces the resistance of the power supply line, i.e., the variation of a DC power supply voltage.

The above conventional laminate printed circuit board has a problem that the designer cannot control the high frequency power supply currents to flow into the power supply layer due to the switching operation of the IC/LSIs. Specifically, the impedance of the full flat power supply layer is so small, a high frequency power supply current output from one IC/LSI flows not only into the decoupling capacitor adjoining it but into the other decoupling capacitors. As a result, the distribution of the high frequency power supply currents in the entire printed circuit board is too complicated to be analyzed with ease. It has therefore been impracticable to determine the capacity of the individual decoupling capacitor IC/LSI by IC/LSI. Moreover, the high frequency power supply currents flown into the power supply layer follow complicated paths due to the full flat configuration of the power supply layer. Consequently, such currents sometimes form large loops which would aggravate the electromagnetic noise and immunity. Although the entire electronic equipment may be housed in a metallic casing, as stated earlier, it is difficult to fully obviate the leakage of electromagnetic noise to the outside of the casing because the casing must be formed with an opening for arranging, e.g., an operation panel.

Technologies relating to the present invention are also taught in, e.g., Japanese Patent Laid-Open Publication Nos. 6-61602, 2-21700 and 6-244582, Japanese Utility Model Laid-Open Publication No. 4-43016, Japanese Patent Laid-Open Publication Nos. 3-273699, 3-208391, 64-25497 and 63-300593, Japanese Utility Model Laid-Open Publication Nos. 61-173167 and 61-38970, and Japanese Patent Laid-Open Publication Nos. 5-235679, 4-302498 and 4-3489.

SUMMARY OF THE INVENTION

It is therefore an object of the present invention to provide a laminate printed circuit board capable of reducing electromagnetic noise to a noticeable degree, and a method of producing the same.

It is another object of the present invention to provide a laminate printed circuit board allowing high frequency power supply currents output from IC/LSIs and turning round to a power supply layer to cause radiations to occur to be controlled, and a method of producing the same.

In accordance with the present invention, in a laminate printed circuit board including a first signal layer, a first ground layer, a power supply layer including a impedance adding circuit in the form of a wiring, a second ground layer and a second signal layer laminated together while being insulated from each other, a magnetic layer having a high saturation flux density is provided either between the impedance adding circuit and the first ground layer or between the said impedance adding circuit and the second ground layer.

Also, in accordance with the present invention, a method of producing a laminate printed circuit board has the steps of forming an impedance adding circuit on a power supply layer formed on an insulation layer, and applying a magnetic substance to at least the impedance adding circuit.

Further, in accordance with the present invention, a method of producing a laminate printed circuit board has the steps of forming an impedance adding circuit on a power supply layer formed on an insulation layer, applying an insulator to at least the impedance adding circuit, and applying a magnetic substance to at least to the impedance adding circuit.

Moreover, in accordance with the present invention, in a method of producing a laminate printed circuit board, at least a power supply layer, a ground layer and a signal layer laminated on an insulation layer, an impedance adding circuit pattern, and a magnetic layer in the form of a pattern covering at least the impedance adding circuit are laminated together.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENTS

Figure 1:
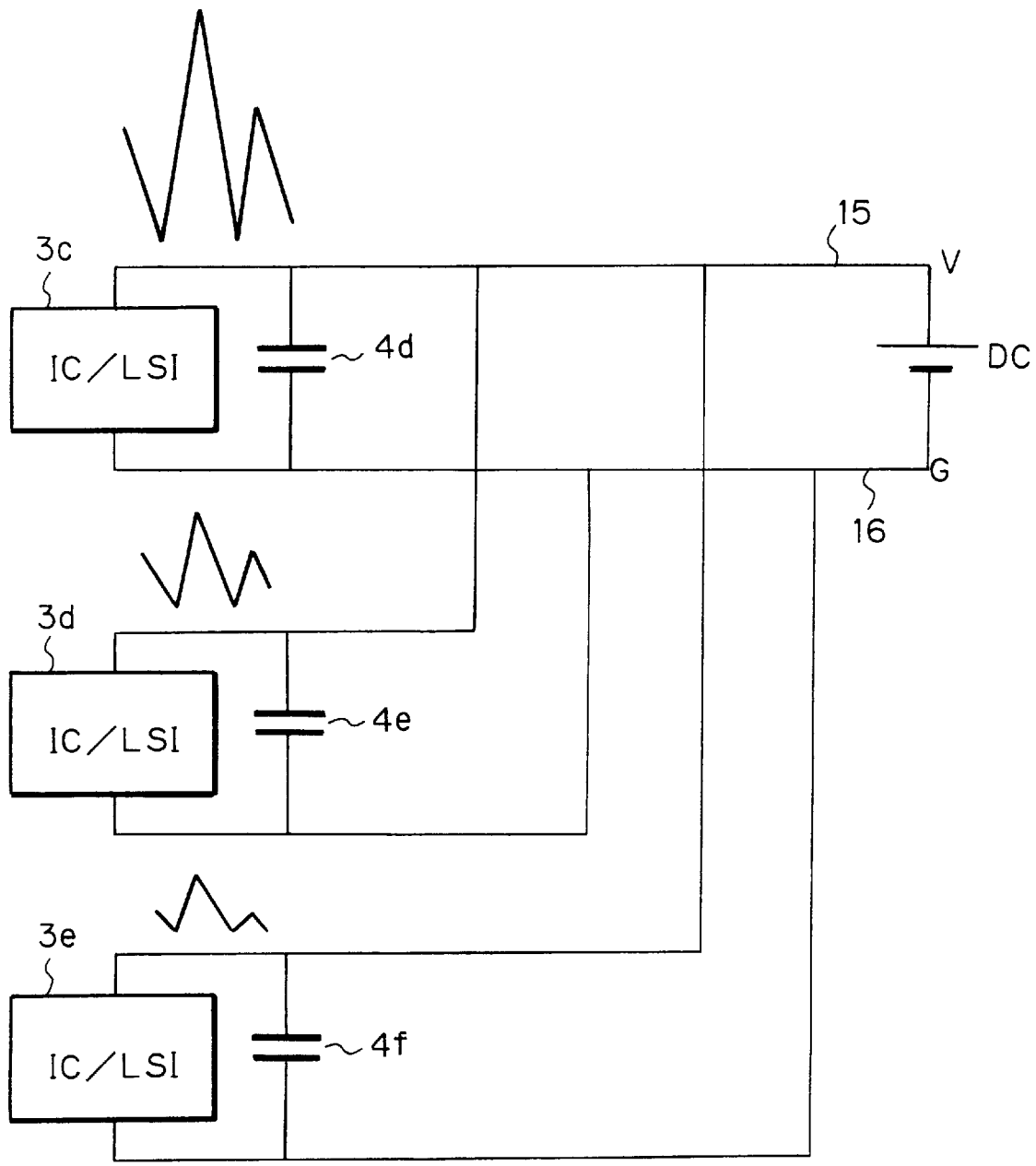
FIG. 1 shows a conventional laminate printed circuit board.

To better understand the present invention, brief reference will be made to a conventional laminate printed circuit board, shown in FIG. 1. As shown, the circuit board includes a power supply line and a ground line implemented by a power supply layer 15 and a ground layer 16, respectively. IC/LSIs 3c, 3d and 3e are connected between the power supply line and the ground line, and each constitutes the source of high frequency power supply current. Decoupling capacitors 4d, 4e and 4f are connected in parallel in the vicinity of the IC/LSIs 3c, 3d and 3e, respectively. When the IC/LSI 3c, for example, performs a switching operation, the resulting high frequency power supply current is bypassed via the coupling capacitor 4d in the vicinity of the IC/LSI 3c. At the same time, voltage variation to occur at the power supply terminal portion of the IC/LSI 3c due to switching is reduced.

The above configuration has the following problems left unsolved. The high frequency power supply currents, labeled I, output from the IC/LSIs 3c–3d are different from each other; that is, a great current I, a medium current I and a small current I are output from the IC/LSIs 3c, 3d and 3e, respectively. In light of this, the decoupling capacitor 4d having a great capacity C (small impedance Z), decoupling capacitor 4e having a medium capacity C (medium impedance Z) and decoupling capacitor 4f having a small capacity C (great impedance Z) are provided in the vicinity of the IC/LSIs 3c, 3d and 3e, respectively. Because the decoupling capacitor 4f adjoining, e.g., the IC/LSI 3e has a great impedance Z, the capacitor 4f cannot fully bypass the power supply current output from the IC/LCI 3e to the ground layer 16. As a result, this current flows into the IC/LSI 3c or 3d and increases the area of a current loop. This is apt to aggravate radiation electromagnetic noise and thereby deteriorate immunity. Further, when the decoupling capacitor associated with any one of the IC/LSIs fails to bypass the power supply current I output from the IC/LSI, the power supply current I flows into the other path and increases the impedance of the path. Consequently, even an AC voltage varies noticeably and degrades the stable operation of the IC/LSI itself.

To solve the above problem, it has been customary to accommodate the entire electronic equipment in a metallic casing for electromagnetic shielding. However, it is difficult to fully obviate the leakage of electromagnetic noise to the outside of the casing because the casing must be formed with an opening for arranging, e.g., an operation panel, as stated earlier.

Briefly, in a laminate printed circuit board including a first signal layer, a first ground layer, a power supply layer including an impedance adding circuit in the form of a wiring, a second ground layer and a second signal layer laminated together while being insulated from each other, the present invention is characterized in that a magnetic layer having a high saturation flux density is provided either between the impedance adding circuit and the first ground layer or between the impedance adding circuit and the second ground layer. The magnetic layer may be provided only on the impedance adding circuit, or may be provided over the entire surface of the power supply layer, or may contact the impedance adding circuit either directly or via an insulator. This successfully improves the power supply layer constituting the source of noise, and thereby substantially reduces the generation of noise in the circuit board.

A conductor constituting the impedance adding circuit may have at least its side covered with an oxide magnetic substance having a high saturation flux density or with an insulator. The magnetic layer or the magnetic substance may be implemented by needle-like magnetic powder and oriented vertically to the direction in which a current flows into the impedance adding circuit. In this case, the needle-like magnetic powder should preferably have a ratio of the longer axis to the shorter axis which is greater than 3 inclusive, but smaller than 10 inclusive.

In any one of the above configurations, to minimize the return path of the signal line, i.e., the route of the return current, the ground layer should preferably be a full flat layer not including openings other than through holes and via holes or independent wirings. The impedance adding circuit with the magnetic substance is formed in the power supply layer. Therefore, a great inductance is achieved without resorting to actual parts, and therefor high frequency power supply currents which flow into decoupling capacitors mounted over a broad area due to the switching operation of ICs/LSIs are reduced. In addition, because decoupling capacitors associated with ICs/LSIs each can have the respective capacity determined independently of the others, it is easy to reduce the variation of AC voltage at the power supply terminal portions of the ICs/LSIs. This promotes the stable operation of the ICs/LSIs.

The impedance adding circuit is constituted by a line pattern achieving the maximum inductance in a limited area, and the magnetic substance overlying, underlying or surrounding the line pattern and having a high saturation flux density. The power supply layer with such an impedance adding circuit is advantageous over the conventional full flat power supply layer in that the designer can determine paths along which currents will flow and can therefore select a particular optimal decoupling capacitor for each IC/LSI which is the source of high frequency power supply current.

Figure 2A:
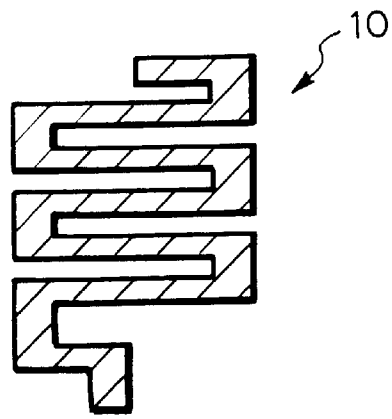
FIGS. 2A–2C each shows a specific configuration of an impedance adding circuit particular to the present invention.
Figure 2B:
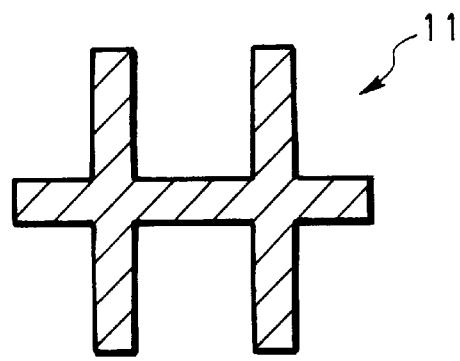
Figure 2C:
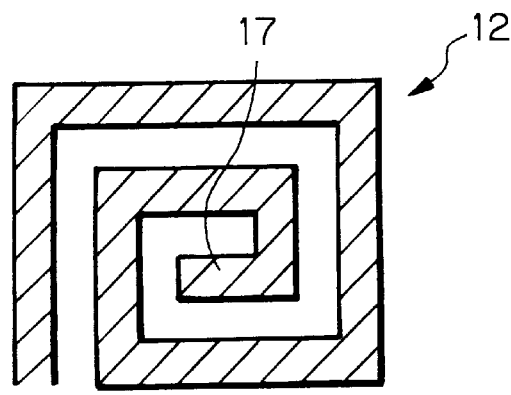

FIGS. 2A–2C each shows a specific configuration of the impedance adding circuit particular to the present invention. In FIG. 2A, the circuit is implemented as a zigzag line pattern 10 having a greater length than a simple straight line pattern connecting two points. Because the inductance of a line pattern increases in proportion to the length of the pattern, the line pattern 10 has a greater inductance than a straight pattern. In addition, the magnetic substance having a high saturation flux density further increases the inductance. As a result, a great inductance is achievable without resorting to actual parts.

FIG. 2C shows a spiral line pattern 12 desirable when a particularly great line inductance is needed in a limited wiring area. The spiral line pattern 12 is advantageous over the zigzag line pattern 10 in that the inductance increases in proportion to the square of the number of turns. As for a wiring from the innermost end 17 of the pattern 12, it is necessary to lead it to the ground layer via a via hole so as to form a wiring pattern with a line length as short as possible, or to lead the wiring to a surface layer loaded with parts via a via hole, connect a capacitor to the point led out with a low impedance, and then return the wiring to the power supply layer.

FIG. 2B shows a crossing line pattern 11. The pattern 11 may be combined with the pattern 10 or 12, if desired. The pattern 11 is a simplified form of the pattern 10.

Figure 3:
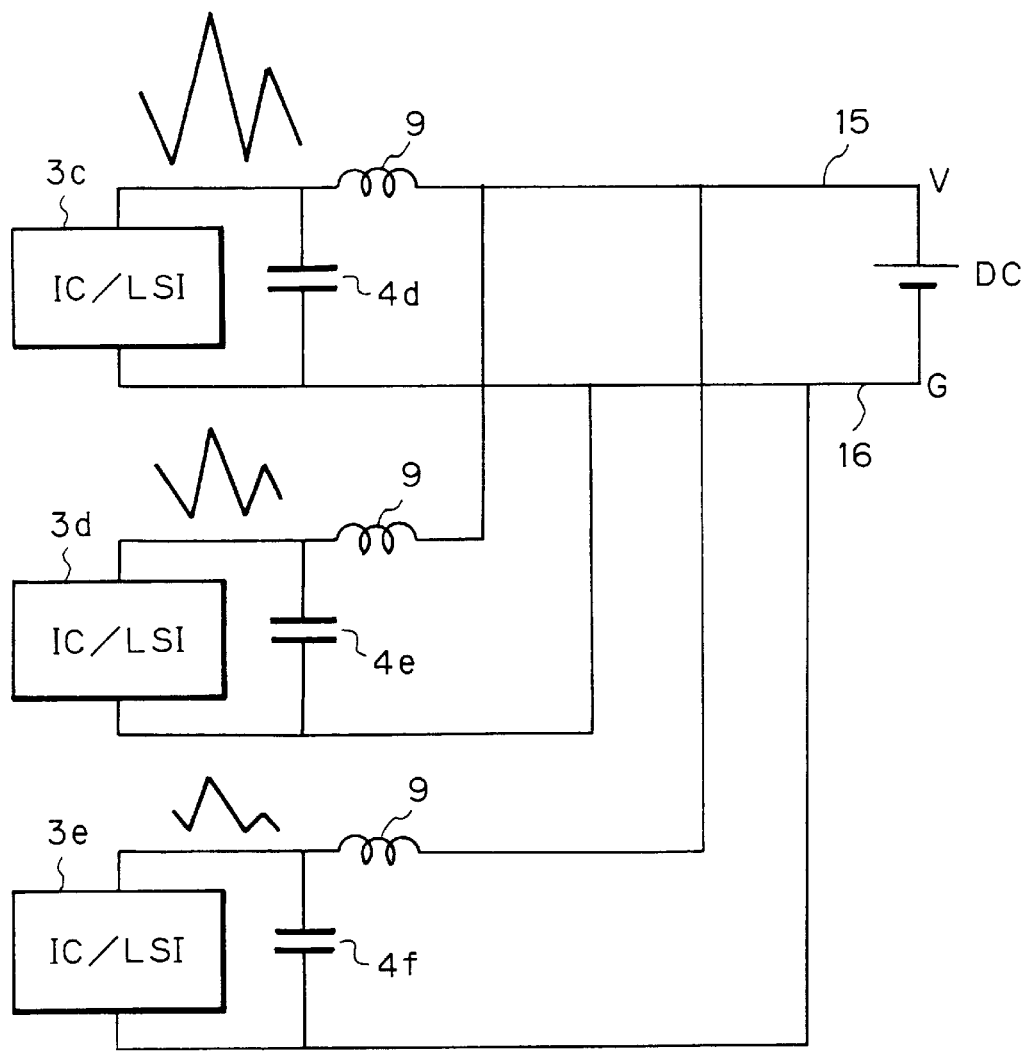
FIG. 3 is diagram for describing the meaning of an inductance particular to the present invention.

Why the impedance adding circuit added to the power supply layer guarantees a distributed inductance is discussed in, e.g., Japanese Patent application No. 8-137904, it will be briefly described with reference to FIG. 3. As shown, IC/LSIs 3c–3e respectively outputting a great current I, a medium current I and a small current I are connected between a power supply line 15 and a ground line 16 in parallel. Decoupling capacitors 4d–4f respectively having a great capacity C, a medium capacity C and a small capacity C are respectively positioned in the vicinity of the IC/LSIs 3c–3e in accordance with the high frequency power supply currents to be output from the LC/LSIs. The capacitors 4d–4f respectively have a small impedance Z, a medium impedance Z, and a great impedance Z. Assume that inductances 9 shown in FIG. 3 are absent. Then, because the decoupling capacitors IC/LSIs 3d–3f each has a particular impedance Z, i.e., because the impedance Z of the capacitor 4f adjoining the IC/LSI 3e is great, the current I output from the IC/LSI 3e cannot be fully bypassed to ground 16 by the capacitor 4f. As a result, this current is apt to flow into the IC/LSI 3c or 3d.

As stated above, the decoupling capacitors 4d–4f cannot sufficiently isolate the IC/LSIs from each other with respect to high frequency alone. With the inductances 9, it is possible to isolate the ICs/LSIs from each other with respect to high frequency, i.e., to allow the decoupling capacitors to bypass the high frequency power supply currents and thereby reduce the current loops.

Figure 4:
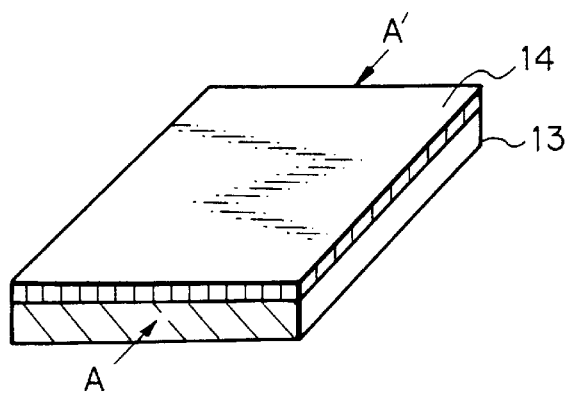
FIG. 4 demonstrates the operation of the present invention.

FIG. 4 shows a specific structure in which a flat magnetic body 14 is laid on a metal plate 13. This structure has an impedance Z for a unit area between points A and A' which is produced by:

$$Z = P_{sd} + j\omega\mu_0(\mu_a 1)d$$

where $P_{sd}$ denotes an impedance derived from the skin effect, $j\omega\mu_0(\mu_a 1)d$ denotes an impedance derived from the magnetic body 14, $\mu_0$ denotes permeability in vacuum, $\mu_a$ denotes the specific permeability of the magnetic body 15, and d denotes the thickness of the magnetic body 14.

The magnetic substance should preferably have a sufficiently great saturation flux density Bs and a sufficiently small residual flux density Br and should preferably be capable of being driven by some degree of current (several amperes). Specifically, it is necessary that the hysteresis characteristic of a magnetization curve be prevented from saturating at some degree of current. More specifically, a certain great high frequency power supply current sometimes flow momentarily into the impedance adding circuit, as typified by a penetration current. The magnetic substance should be capable of being driven even in such a condition.

Laid-Open Publication No. 6-244582 mentioned earlier is directed toward the shielding of noise output from a laminate printed circuit board and from other laminate printed circuit boards surrounding it which would bring about crosstalk and other troubles. The present invention improves the power supply layer, which is the source of noise, in order to prevent the printed circuit board including the power supply layer from generating noise.

1st Embodiment

Figure 5A:
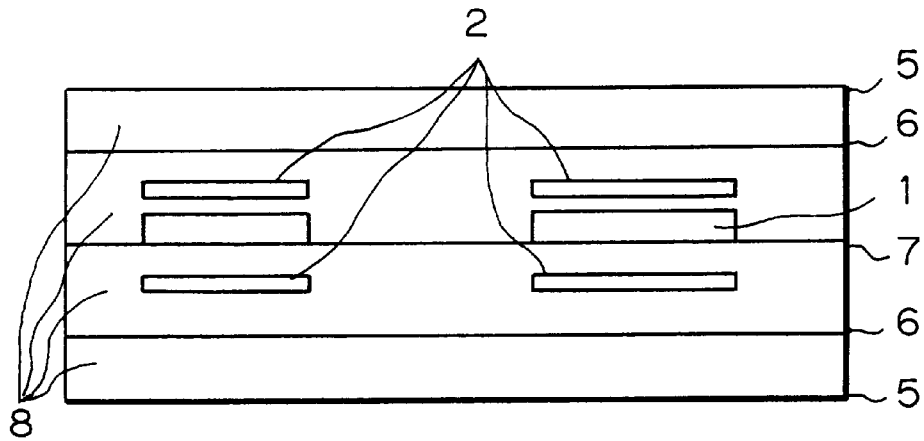
FIGS. 5A–5C show a first embodiment of the laminate printed circuit board in accordance with the present invention.
Figure 5B:
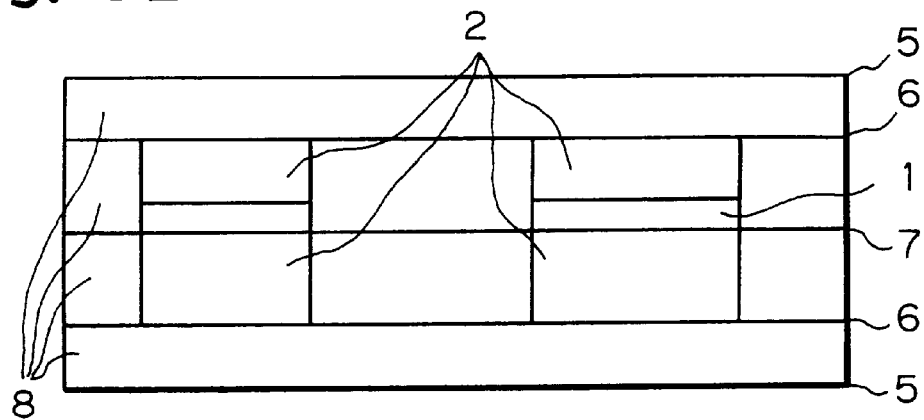
Figure 5C:
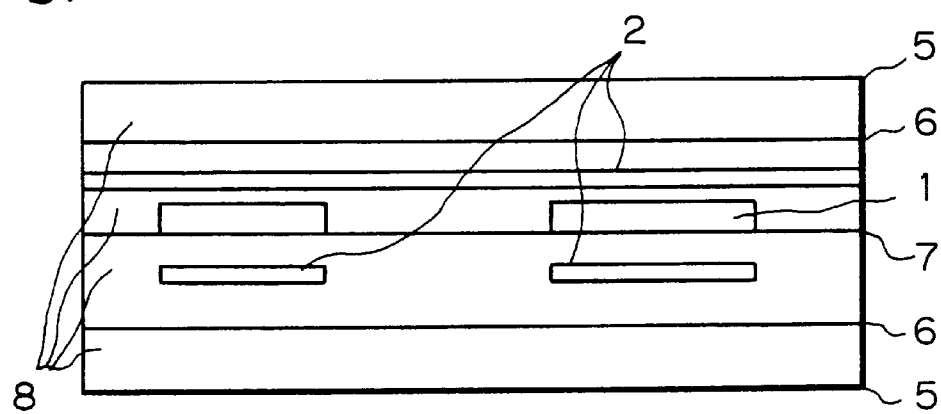

Referring to FIGS. 5A–5C, a laminate printed circuit board embodying the present invention is shown. As shown, a signal layer 5, a ground layer 6 and a power supply layer 7 are laminated with the intermediary of insulation layers 8. In the illustrative embodiment, an impedance adding circuit 1 is formed in the power supply layer 7. A magnetic layer 2 is positioned at least above or at least below the impedance adding circuit 1.

Specifically, in one configuration shown in FIG. 5A, the insulation layers 8 intervene between the impedance adding circuit 1, the ground layer 6, and the magnetic layers 2. Alternatively, the magnetic layers 2 may be so formed as to respectively contact the tops and bottoms of the impedance adding circuit 1. In another configuration shown in FIG. 5B, the insulation layer 8 is absent between the impedance adding circuit 1 and the ground layer 6. In still another configuration shown in FIG. 5C, the magnetic layer 2 extends not only over the impedance adding circuit 1 but also over the entire power supply layer 7. In any one of such configurations, although the insulation layer 8 between the spaced portions of the impedance adding circuit 1 is not essential, it is desirable in order to reduce irregularities in the surface configuration of the circuit board.

Figure 6:
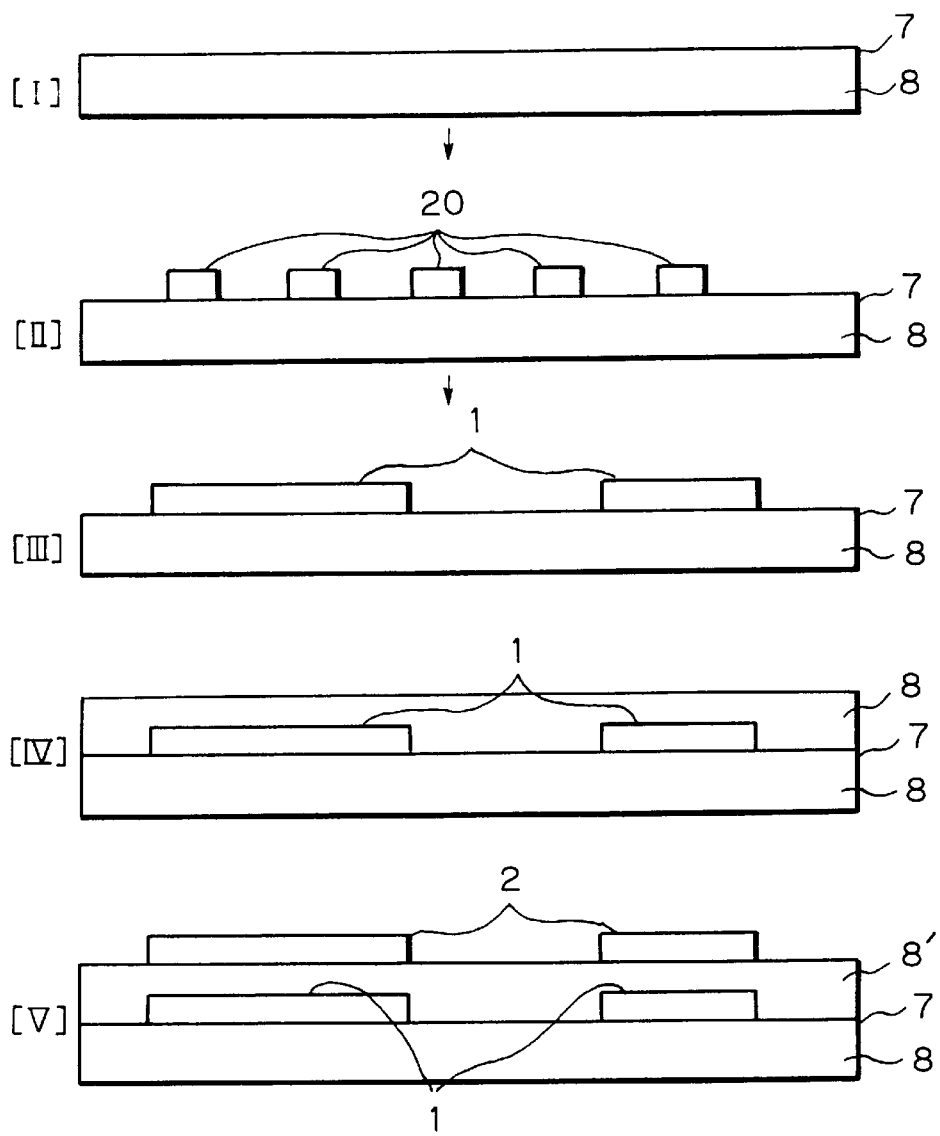
FIG. 6 demonstrates a procedure for producing the printed circuit board shown in FIGS. 5A–5C.

FIG. 6 shows a procedure for producing the circuit board having the configuration of FIG. 5A. As shown, in a step [I], the power supply layer 7 is formed on the insulation layer 7. In the next step [II], a conductor 20 is formed on the power supply layer 7. Then, in a step [III], the impedance adding circuit 1 is formed. Subsequently, in a step [IV], an insulator is applied at least to the impedance adding circuit 1. In a step [V], a magnetic substance is applied to the insulator. When the magnetic layer 2 should be formed below the power supply layer 7 as well, the insulation layer 2 may be formed below the impedance adding circuit 1 in the step [V] or the magnetic substance may be buried beforehand in the portions of the insulation layer 8 where the impedance adding layer 1 is to be formed. Finally, the ground layer 6 and signal layer 5 respectively formed on the insulation layers 8 are stacked in order to complete the circuit board shown in FIG. 5A.

If desired, the magnetic substance may be directly applied to the impedance adding circuit 1, omitting the step [IV] shown in FIG. 6.

Figure 7:
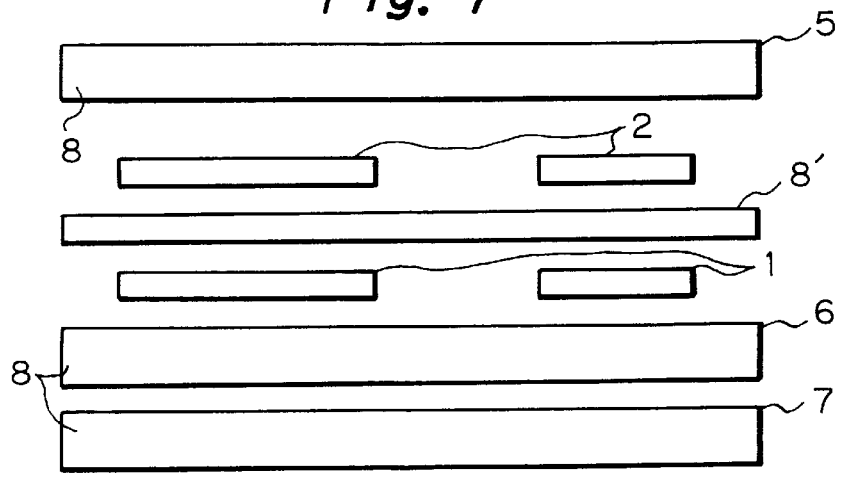
FIG. 7 shows another procedure for producing the printed circuit board shown in FIGS. 5A–5C.

FIG. 7 shows another sequence of steps for producing the circuit board of FIG. 5A. As shown, the signal layer 5, ground layer 6 and power supply layer 7 are respectively formed on the insulation layers 8. The impedance adding circuit pattern 1 and magnetic layer pattern 2 are formed beforehand. The above layers 5–7 and patterns 1 and 2 are laminated together. The impedance adding circuit pattern 1 may be buried in an insulator 8' or the magnetic substance 2 beforehand, if desired.

The configurations shown in FIGS. 5B and 5C are also achievable by any one of the procedures described above with reference to FIGS. 6 and 7.

In the illustrative embodiment, the magnetic substance 2 may be implemented by oxide soft magnetic ferrite, e.g., lithium ferrite (Bs=5,000 gauss) or Ni-Zn ferrite (Bs=5,300 gauss) or by metal soft magnetic substance, e.g., Fe-Ni Permalloy (Bs=1,400 gauss) or Fe-Al-Si Sendust (10,000 gauss). Such a substance may be used in the form of powder or a sheet. As for the metallic magnetic substance, it should be used in combination with the insulator, as shown in FIG. 5A, because of its conductivity.

The magnetic powder should preferably have a mean grain size between 1 μm and 40 μm customary with the production of, e.g., thick film wirings. Powder with grain sizes below 1 μm is difficult to produce while powder with grain sizes above 40 μm is difficult to apply evenly.

When use is made of the magnetic powder, it is mixed with a solvent and applied in the form of a paste. Experiments showed that a desirable mixture ratio of the magnetic powder to the solvent in weight is between 3/7 and 9/1. Mixture ratios below 3/7 prevented the impedance adding circuit from achieving the expected function while mixture ratios above 9/1 made the application difficult.

Needle-like magnetic powder having a ratio of the longer axis to the shorter axis between 3 and 10 was mixed with a solvent. The resulting paste was used to form a magnetic body oriented vertically to the direction in which a current flew. With such needle-like magnetic powder, the impedance adding circuit exhibited a far more desirable effect than with magnetic powder having a usual shape. Ratios of the longer axis to the shorter axis of less than 3 made the use of the needle-like magnetic power meaningless while ratios of greater than 10 make the even application difficult.

Figure 8:
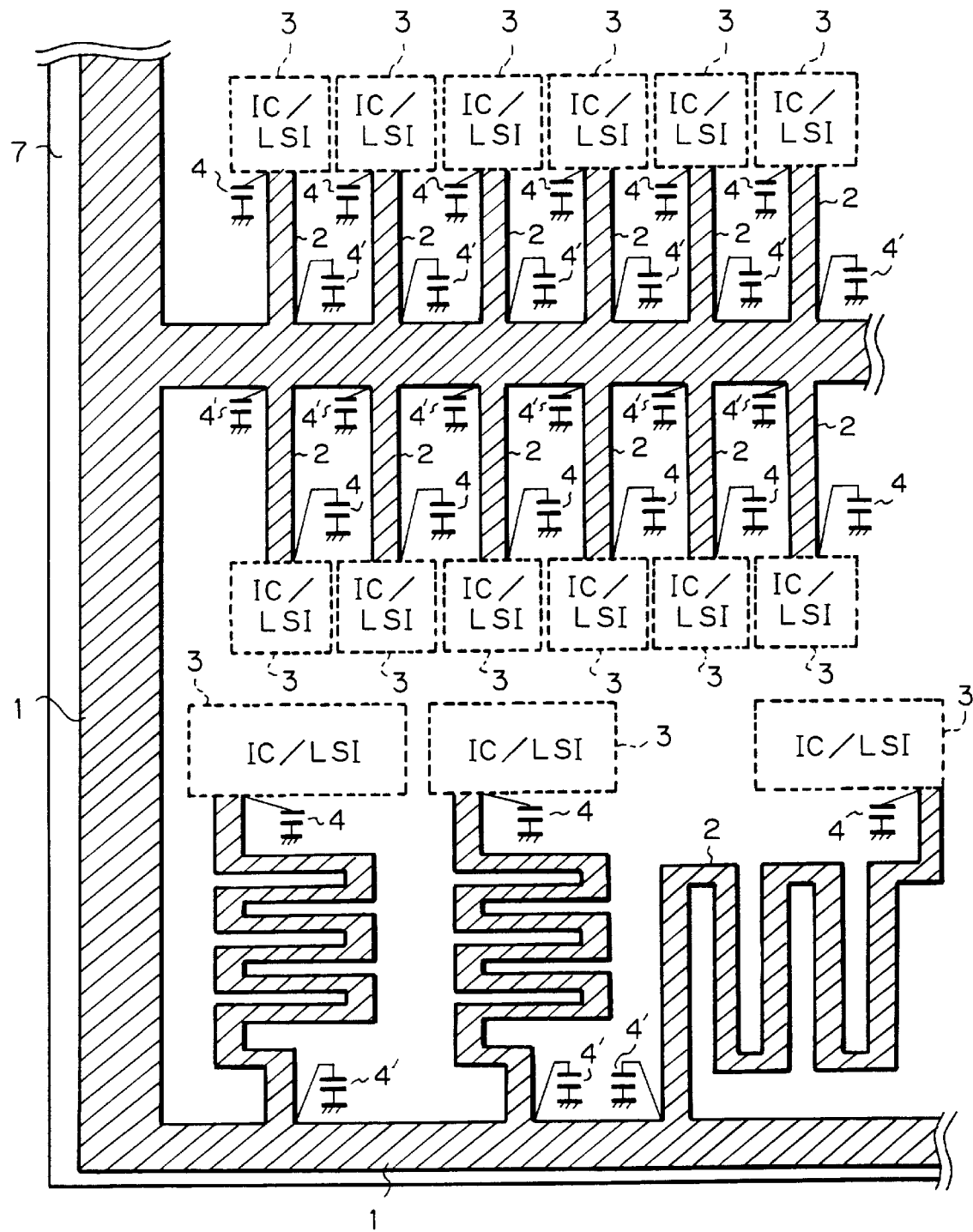
FIG. 8 is a plan view of a power supply layer included in the first embodiment.

FIG. 8 is a plan view showing the power supply layer 7. As shown, all IC/LSIs 3 implemented by the power supply layer 7 are commonly connected between the power supply line and the ground layer. Decoupling capacitors 4 each is positioned in the vicinity of the respective IC/LSI 3. Further, when a power supply circuit is commonly connected to decoupling capacitors 4', a distributed inductance is guaranteed by the wirings of the impedance adding circuit of the power supply layer 7.

The above distributed inductance constitutes a filter together with the decoupling capacitors 4 and 4' and reduces high frequency power supply currents ascribable to the switching operation of the IC/LSIs 3. More specifically, with the filter, it is possible to noticeably reduce the high frequency power supply currents to flow into the power supply line via the decoupling capacitors 4 adjoining the IC/LSIs 3 due to the operation of the IS/LSIs 3, compared to the conventional laminate printed circuit board. This successfully reduces electromagnetic radiations from the printed circuit board. It is to be noted that because the distributed inductance is adjustable on the basis of the configuration of the impedance adding circuit, the constant of the filter can be adjusted.

Moreover, if a magnetic layer is provided at least above, below or beside the impedance adding circuit shown in FIG. 8, electromagnetic radiations via the conventional metallic casing can be sufficiently reduced. The metallic casing may even be omitted, if desired.

2nd Embodiment

Figure 9A:
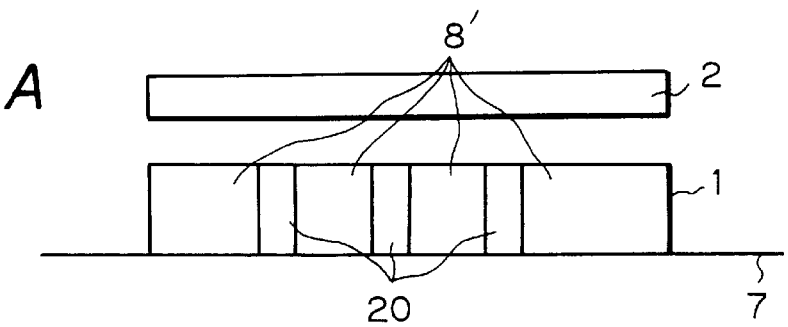
FIGS. 9A–9D show a second embodiment of the present invention.

An alternative embodiment of the present invention will be described with reference to FIGS. 9A–9D. FIG. 9A shows the impedance adding circuit 1 having conductors 20 separated from each other by insulators 8'. An insulation layer may be provided between the conductors 20 and the magnetic layer 2 also. This will obviate current leakage when the magnetic layer 2 is electrically conductive.

Figure 9B:
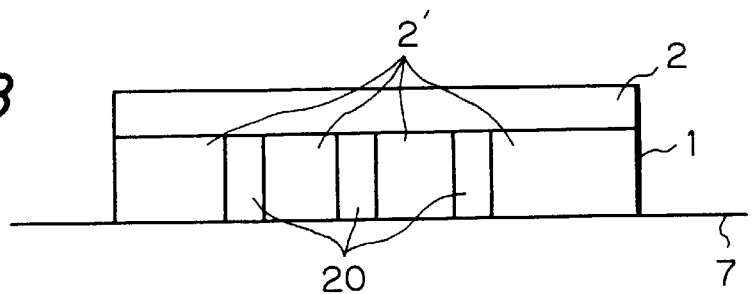
Figure 9C:
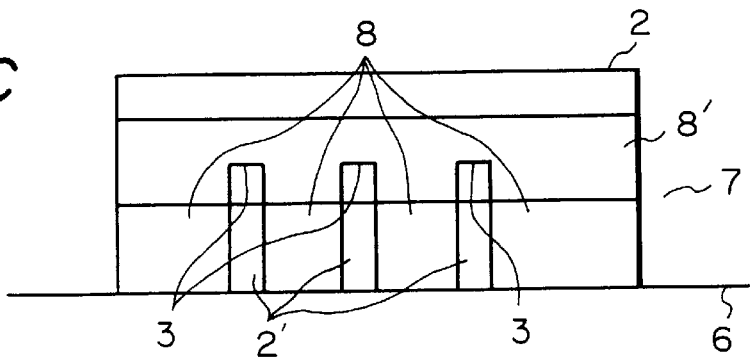

FIG. 9B shows another configuration in which the conductors 20 constituting the impedance adding circuit 1 are separated from each other by magnetic bodies 2'. This configuration, when combined with the configuration of FIG. 5B, allows the entire periphery of each conductor 20 to be surrounded by a magnetic substance, implementing a magnetically closed loop. As shown in FIG. 9C, the magnetic bodies 2' may be positioned only below the conductors 3, if desired.

Figure 9D:
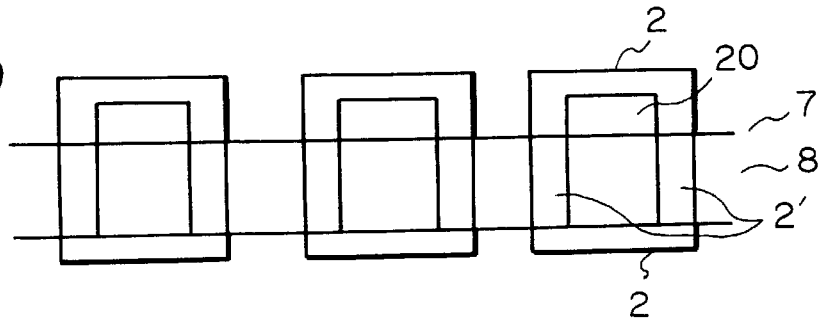

FIG. 9D shows still another configuration in which the magnetic bodies 2' are received in through holes formed in the right and left insulators 8 of the impedance adding circuit 1. That is, the magnetic bodies 2' are arranged in the form of a picture frame, adjoining the line side and adjoining the other side via the insulator. Such magnetic bodies 2' form a magnetically closed loop and realize a great inductance efficiently. The sectional area of each picture frame constituted by the magnetic bodies 2' and the number of magnetic bodies 2' for a unit length are adjustable to implement a desired inductance. This kind of configuration is desirable when magnetic bodies constituting a closed loop should be formed by use of magnetic powder.

Figure 10:
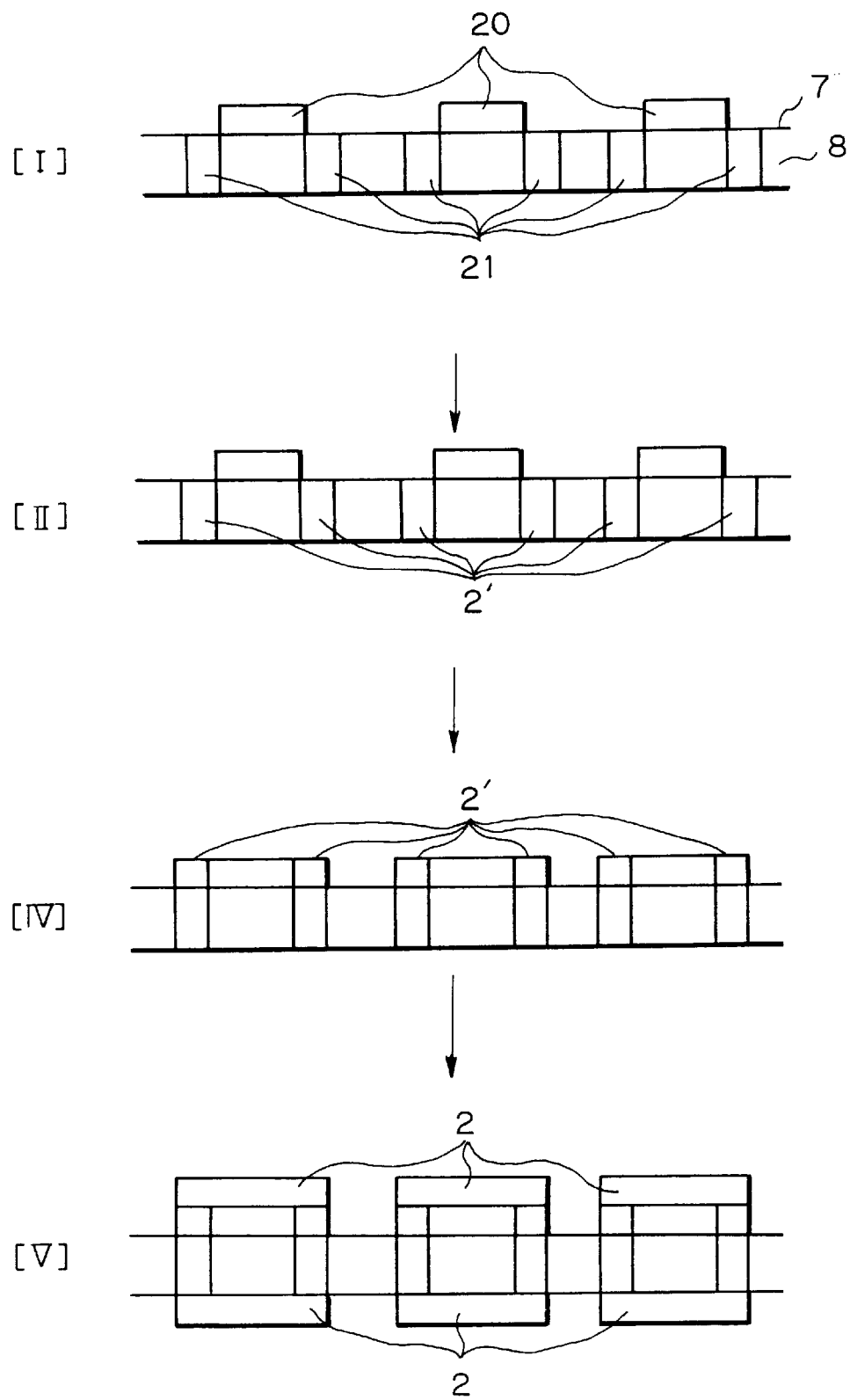
FIG. 10 shows a procedure for producing the printed circuit board of FIGS. 9A–9D.

FIG. 10 shows a consecutive steps [I]–[IV] for producing the impedance adding circuit having the configuration of FIG. 9D. First, in the step [I], through holes 21 are formed in the power supply layer 7 overlying the insulation layer 8 at the right and left of the conductors 20 with respect to the widthwise direction of the conductors 20. In the next step [II], the magnetic bodies 2' are filled in the through holes 21. Subsequently, in the step [III], the magnetic bodies 2' are again formed on the above magnetic bodies 2' to be substantially flush with the conductors 20. Finally, in the step [IV], the magnetic layers 2 are formed on the tops of the conductors 20 and right and left magnetic bodies 2' and formed on the bottoms of the same via the insulation layer 8.

Experiments showed that the configuration of FIG. 9D should have a sectional area parallel to the lengthwise direction of the line which is between 0.03 mm$^2$ and 0.4 mm$^2$ for a unit length (mm). Sectional areas outside of the above range would prevent the inductance adding circuit to function in the expected manner or would render the even application difficult.

3rd Embodiment

The first and second embodiments shown and described each has magnetic bodies positioned on an impedance adding circuit formed on the surface of an insulator or a thin magnetic substance applied to the insulator. A third embodiment to be described with reference to FIG. 11 forms the conductors by a different method. As shown, in a step [I], the metallic conductor or wire 3 is coated with the magnetic body 2'. Further, in a step [II], the magnetic body 2' may be coated with insulating high molecular resin 18. The conductor or wire 3 having either one of such two structures is so arranged as to form a desired impedance adding circuit.

Figure 11:
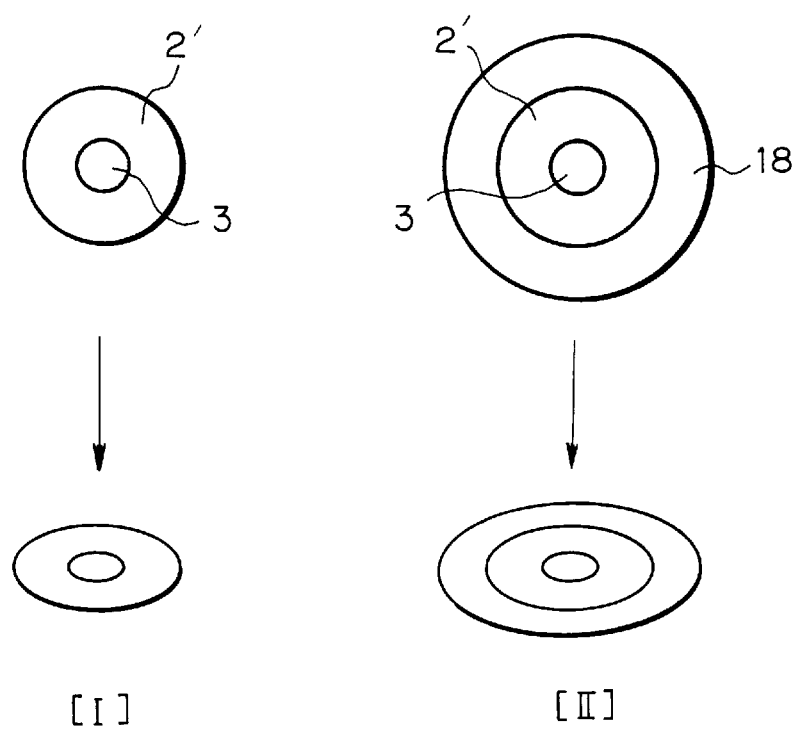
FIG. 11 shows a third embodiment of the present invention.
Figure 12:
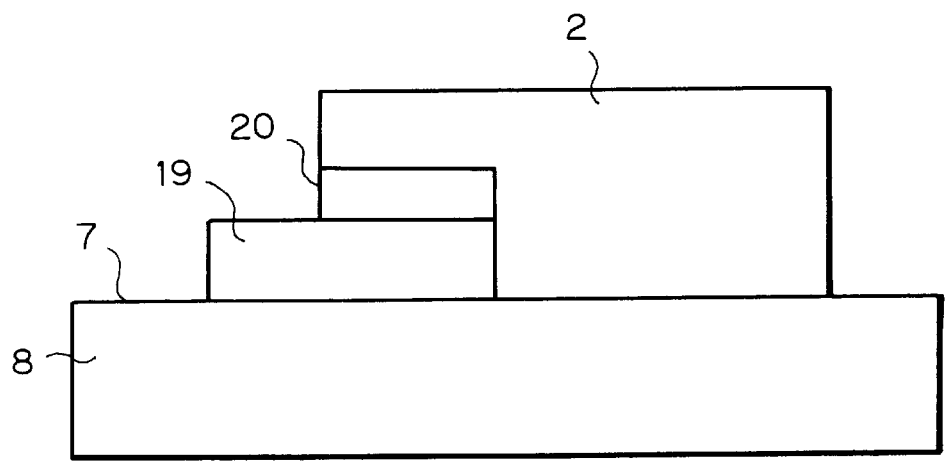
FIG. 12 shows a procedure for producing the printed circuit board shown in FIG. 11.

The conductor or wire 3 shown in FIG. 11 should preferably be formed flat by pressing or rolling. As shown in FIG. 12, the conductor or wire 3 is connected to an electrode pad provided on the printed circuit board by having its coating removed.

An original printed circuit board having an entirely flat power supply layer and the various printed circuit boards available with the above embodiments were applied to an engineering work station (EWS) in order to measure radiation magnetic fields. Specifically, the original printed circuit board and the printed circuit boards of the illustrative embodiments were compared with respect to frequencies of 320 MHz, 360 MHz, 480 MHz, 800 MHz and 920 MHz of the spectrum of a multiple wave of a clock frequency (40 MHz). Table 1 shown below lists the results of measurement.

TABLE 1

| No | Powder Mean Grain size (μm) | Powder Packing Ratio | Magnetic Body Thickness (μm) | Insulator Thickness (μm) | Sectional Area (mm²)/Length (mm) | Ratio of Needle Like Powder | Magnetic Substance | Improvement (dB) (Frequency: MHz) | | | | |
|---|---|---|---|---|---|---|---|---|---|---|---|---|
| | | | | | | | | 320 | 360 | 480 | 800 | 920 |
| 1 | 1 | 15 | 4/1 | 90 | 20 | — | — | L | −8 | −8 | −8 | −8 | −7 |
| 2 | 1 | 15 | 4/1 | 90 | 20 | (application to one side) | — | L | −6 | −6 | −6 | −5 | −5 |
| 3 | 2 | 3 | 4/1 | 150 | 30 | — | — | L | −8 | −7 | −7 | −7 | −7 |
| 4 | 3 | 10 | 3/7 | 300 | — | — | — | N | −8 | −8 | −10 | −8 | −7 |
| 5 | 4 | 35 | 3/2 | 30 | — | — | — | N | −7 | −7 | −8 | −8 | −6 |
| 6 | 5 | 7 | 9/1 | 50 | 20 | — | — | N | −6 | −7 | −8 | −7 | −5 |
| 7 | 6 | — | — | 100 | 30 | — | — | P | −7 | −7 | −8 | −6 | −5 |
| | | | | | | | | S | −6 | −7 | −7 | −5 | −5 |
| 8 | 7 | 5 | 4/1 | 100 | — | 0.4 | 5 | L | −8 | −8 | −10 | −7 | −7 |
| | | | | | | 0.1 | 8 | L | −6 | −7 | −7 | −5 | −5 |
| 9 | 8 | 20 | 7/3 | 100 | 20 | — | — | N | −7 | −7 | −8 | −6 | −5 |
| | | | | | | | 3 | N | −7 | −7 | −7 | −7 | −5 |
| 10 | 10 | — | 1/1 | 200 | — | — | 10 | N | −8 | −8 | −10 | −7 | −6 |

As for "Magnetic Substance" included in the above Table 1, L, N, P and S respectively stand for lithium ferrite, Ni-Zn ferrite, Permalloy, and Sendust, respectively.

As Table 1 indicates, the illustrative embodiments each having the power supply layer wired and the magnetic bodies reduce radiation magnetic field to a noticeable degree, compared to the original printed circuit board. Specifically, the wiring implemented by the impedance adding circuit and the arrangement of the magnetic bodies enhance the filtering effect of the decoupling capacitors and thereby reduce radiation noise.

In summary, it will be seen that the present invention provides a laminate printed circuit board achieving a great inductance without resorting to actual parts and therefor reducing high frequency power supply currents which flow into decoupling capacitors mounted over a broad area due to the switching operation of ICs/LSIs. In addition, because the decoupling capacitors associated with the ICs/LSIs each can have the respective capacity determined independently of the others, it is easy to reduce the variation of AC voltage at the power supply terminal portions of the ICs/LSIs. This promotes the stable operation of the ICs/LSIs.

Various modifications will become possible for those skilled in the art after receiving the teachings of the present disclosure without departing from the scope thereof.

What is claimed is:

1. In a laminate printed circuit board including a first signal layer, a first ground layer, a power supply layer including an impedance adding circuit in a form of a wiring, a second ground layer and a second signal layer laminated together while being insulated from each other, a magnetic layer having a high saturation flux density is provided at least between said impedance adding circuit and said first ground layer or between said impedance adding circuit and said second ground layer.

2. A laminate printed circuit board as claimed in claim 1, wherein said magnetic layer is formed on an entire surface of said power supply layer.

3. A laminate printed circuit board as claimed in claim 2, wherein said magnetic layer is formed of an oxide and contacts said impedance adding circuit.

4. A laminate printed circuit board as claimed in claim 3, wherein said impedance adding circuit contacts at least one of said first ground layer and said second ground layer with the intermediary of said magnetic layer.

5. A laminate printed circuit board as claimed in claim 2, wherein said magnetic layer contacts said impedance adding circuit with the intermediary of an insulator.

6. A laminate printed circuit board as claimed in claim 5, wherein said magnetic layer is formed of a metallic magnetic substance.

7. A laminate printed circuit board as claimed in claim 2, wherein said wiring constituting said impedance adding circuit has at least a side thereof covered with an oxide magnetic substance having a high saturation flux density.

8. A laminate printed circuit board as claimed in claim 2, wherein said wiring constituting said impedance adding circuit has at least a side thereof covered with an insulator.

9. A laminate printed circuit board as claimed in claim 2, wherein said magnetic layer or said magnetic substance comprise needle-like magnetic powder and is oriented vertically to a direction in which a current flows into said impedance adding circuit.

10. A laminate printed circuit board as claimed in claim 9, wherein the needle-like magnetic powder has a ratio of a longer axis to a shorter axis which is greater than 3 inclusive, but smaller than 10 inclusive.

11. A laminate printed circuit board as claimed in claim 1, wherein said magnetic layer is formed of an oxide and contacts said impedance adding circuit.

12. A laminate printed circuit board as claimed in claim 11, wherein said impedance adding circuit contacts at least one of said first ground layer and said second ground layer with the intermediary of said magnetic layer.

13. A laminate printed circuit board as claimed in claim 11, wherein said wiring constituting said impedance adding circuit has at least a side thereof covered with an oxide magnetic substance having a high saturation flux density.

14. A laminate printed circuit board as claimed in claim 11, wherein said wiring constituting said impedance adding circuit has at least a side thereof covered with an insulator.

15. A laminate printed circuit board as claimed in claim 11, wherein said magnetic layer or said magnetic substance comprise needle-like magnetic powder and is oriented vertically to a direction in which a current flows into said impedance adding circuit.

16. A laminate printed circuit board as claimed in claim 15, wherein the needle-like magnetic powder has a ratio of a longer axis to a shorter axis which is greater than 3 inclusive, but smaller than 10 inclusive.

17. A laminate printed circuit board as claimed in claim 1, wherein said magnetic layer contacts said impedance adding circuit with the intermediary of an insulator.

18. A laminate printed circuit board as claimed in claim 17, wherein said magnetic layer is formed of a metallic magnetic substance.

19. A laminate printed circuit boards as claimed in claim 17, wherein said wiring constituting said impedance adding circuit has at least a side thereof covered with an oxide magnetic substance having a high saturation flux density.

20. A laminate printed circuit board as claimed in claim 17, wherein said wiring constituting said impedance adding circuit has at least a side thereof covered with an insulator.

21. A laminate printed circuit board as claimed in claim 17, wherein said magnetic layer or said magnetic substance comprise needle-like magnetic powder and is oriented vertically to a direction in which a current flows into said impedance adding circuit.

22. A laminate printed circuit board as claimed in claim 21, wherein the needle-like magnetic powder has a ratio of a longer axis to a shorter axis which is greater than 3 inclusive, but smaller than 10 inclusive.

23. A laminate printed circuit board as claimed in claim 1, wherein said wiring constituting said impedance adding circuit has at least a side thereof covered with an oxide magnetic substance having a high saturation flux density.

24. A laminate printed circuit board as claimed in claim 23, wherein said magnetic layer or said magnetic substance comprise needle-like magnetic powder and is oriented vertically to a direction in which a current flows into said impedance adding circuit.

25. A laminate printed circuit board as claimed in claim 24, wherein the needle-like magnetic powder has a ratio of a longer axis to a shorter axis which is greater than 3 inclusive, but smaller than 10 inclusive.

26. A laminate printed circuit board as claimed in claim 1, wherein said wiring constituting said impedance adding circuit has at least a side thereof covered with an insulator.

27. A laminate printed circuit board as claimed in claim 1, wherein said magnetic layer or said magnetic substance comprise needle-like magnetic powder and is oriented vertically to a direction in which a current flows into said impedance adding circuit.

28. A laminate printed circuit board as claimed in claim 27, wherein the needle-like magnetic powder has a ratio of a longer axis to a shorter axis which is greater than 3 inclusive, but smaller than 10 inclusive.

29. In a method of producing a laminate printed circuit board, at least a power supply layer, a ground layer and a signal layer laminated on an insulation layer, an impedance adding circuit pattern positioned on a portion of said power supply layer said portion being less than a full area of said power supply layer, and a magnetic layer in a form of a pattern covering at least said impedance adding circuit are laminated together.

30. A method as claimed in claim 29, wherein said impedance adding circuit pattern is formed in an insulator or a magnetic substance.

31. A method as claimed in claim 29, wherein said impedance adding circuit pattern comprises one of a metallic conductor and a metallic wire each being coated at least with a magnetic substance.

32. A method as claimed in claim 31, wherein the metallic conductor or the metallic wire is further coated with insulating high molecular resin.

\* \* \* \* \*